United States Patent [19]
Takahashi et al.

[11] Patent Number: 6,048,631
[45] Date of Patent: Apr. 11, 2000

[54] ORGANIC ELECTROLUMINESCENCE DEVICE AND ORGANIC ELECTROLUMINESCENCE DEVICE MATERIAL

[75] Inventors: Hisamitsu Takahashi; Yoshihisa Tsuruoka; Satoshi Tanaka; Toshio Miyauchi, all of Mobara, Japan

[73] Assignee: Futaba Denshi Kogyo K.K., Mobara, Japan

[21] Appl. No.: 08/893,757

[22] Filed: Jul. 11, 1997

[30] Foreign Application Priority Data

Jul. 12, 1996 [JP] Japan .................. 08-183610

[51] Int. Cl.[7] ............................... H05B 33/14
[52] U.S. Cl. ................ 428/690; 428/691; 428/917; 313/504; 548/224; 548/101
[58] Field of Search ................... 428/690, 691, 428/917; 313/504; 548/224, 101

[56] References Cited

U.S. PATENT DOCUMENTS

| | | | |
|---|---|---|---|
| 5,151,629 | 9/1992 | VanSlyke | 313/504 |
| 5,484,922 | 1/1996 | Moore et al. | 546/7 |
| 5,552,547 | 9/1996 | Shi | 546/7 |
| 5,747,183 | 5/1998 | Shi et al. | 428/690 |

OTHER PUBLICATIONS

08/864,374 May 28, 1997, Pending.
08/893,757 Jul. 11, 1997, Pending.
"The Development of Chelate Metal Complexes as an Organic Electroluminescent Material" by Yuji Hamada in IEEE Transactions on Electron Devices vol. 44, No. 8, pp. 1208–1217, Aug. 1997.

"Recent Developments in Molecular Organic Electroluminescent Materials" by C.H. Chen et al in Macromol. Symp. vol. 125, pp. 17–19, 1997.

*Primary Examiner*—Charles Nold
*Attorney, Agent, or Firm*—Oblon, Spivak, McClelland, Maier & Neustadt, P.C.

[57] ABSTRACT

An object of this invention is to provide an organic EL device material stable against heat, having a high purity in bluish light emission and a high efficiency. The organic EL device comprises a glass substrate, a transparent anode, a TPD which is an electron hole implanted transporting layer, an organic luminous layer, $Alq_3$ which is an electron implanted transporting layer and a cathode. The organic luminous layer is an aluminum complex which is $\mu$-oxozi [bis(2-(2-benzo oxazolyl)-phenolate) aluminum (III)]. Plus and minus DC voltages are applied to the anode and cathode respectively. The organic luminous layer indicates bluish light emission of 1314 $cd/m^2$ at 16V. A peak wave length of the luminous spectrum is 420 nm and chromaticity coordinates are x=0.185 and y=0.178 and a high purity as bluish color is assured. The organic EL device material is stable against heat and difficult to deteriorate. Because the device structure is three-layer structure in which the organic luminous layer is sandwiched by an electron implanted transporting layer and an electron hole implanted transporting layer, diffusion of exciton to electrodes is prevented thereby improving the efficiency and reactive current is reduced thereby improving the service life.

12 Claims, 3 Drawing Sheets

ORGANIC ELECTROLUMINESCENCE DEVICE AND ORGANIC ELECTROLUMINESCENCE DEVICE MATERIAL

BACKGROUND OF THE INVENTOR

1. Field of the Invention

This invention relates to organic electroluminescence device material (hereinafter referred to as organic EL device material) suitable for organic electroluminescence device (hereinafter referred to as organic EL device) and organic luminous layer of organic electroluminescence device.

2. Description of the Prior Art

The organic EL device is a luminous device having an laminated structure in which a thin film of organic luminous layer containing fluorescent organic compound is sandwiched by a cathode and an anode, producing electroluminescence coinciding with fluorescent spectrum by implanting electrons and electron holes to rejoin them.

As for the structure of the organic EL device, organic EL devices having any one of the following three structures, ① a structure in which electron hole transporting layer and organic luminous layer are combined, ② a structure in which electron transporting layer and organic luminous layer are combined and ③ a structure in which organic luminous layer is sandwiched by electron hole transporting layer and electron transporting layer, the respective structures being disposed between the anode and cathode have been known.

FIG. 5 shows a basic composition of an organic EL having the above ① structure in which electron hole transporting layer and organic luminous layer are combined. On a light transmitting substrate 100 are placed successively a light transmitting anode 101 of ITO (indium tin oxide) or the like, an electron hole transporting layer 102, an organic luminous layer 103 and a cathode 104 of Mg:Ag alloy or the like. Here, the thickness of the electron hole transporting layer 102 and the organic luminous layer 103 which are organic thin films is about 50 nm for both. If minus DC current is applied to the cathode 104 and plus DC current is applied to the anode 101, the organic luminous layer 103 emits light. This emitted light is picked out from the ITO side through the substrate 100. Formation of the respective films are carried out by vacuum deposition.

Here, the above organic luminous layer 103 is made of $Alq_3$ expressed by Formula 2. $Alq_3$ is 8-hydroxy quinoline aluminum which is a chelate complex in which 8-hydroxy/quinoline is connected to Al in the center in chelate combination style. The above organic luminous layer 103 made of $Alq_3$ emits green light of 550 nm in peak wave length.

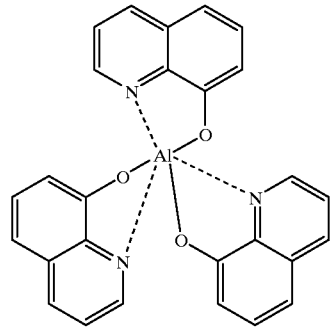

[Formula 2]

Here, the above electron hole transporting layer 102 is diamine expressed by Formula 3.

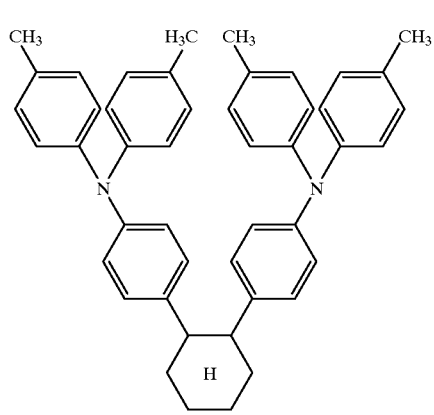

[Formula 3]

Although the above $Alq_3$ is a material excellent in terms of luminance, thermal stability and the like as organic EL device material for use in the above organic luminous layer 103, its emitted light is green as described above. To make the organic EL device into multi-color or full color, organic EL device material (phosphor) emitting blue and red colors having full luminance and practical purity is necessary in addition to organic EL device material emitting green light.

As organic EL device material producing blue light emission, azomethyn zinc complex Zn (1AZM-Hex) expressed by Formula 4 and benzoxazole zinc complex $Zn(OXZ)_2$ expressed by Formula 5 have been known.

[Formula 4]

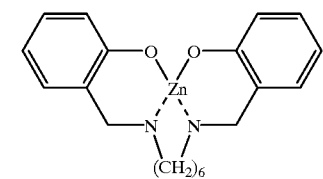

[Formula 5]

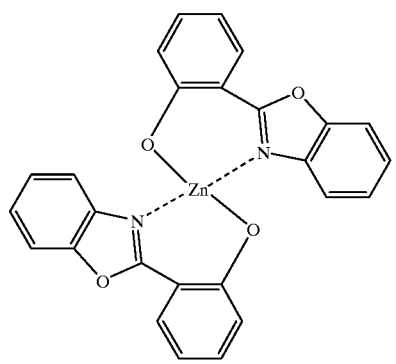

Although there are a number of organic materials producing blue fluorescence, the number of those that can be used as organic EL material is small. The reason is that the following conditions are not satisfied.

(1) Fluorescence of thin film must be blue color having a purity allowing its practical use.

(2) The thin film is thermally stable so that it is not coagulated despite a long-term storage.

That is, if the melting point is low, the thin film is subjected to physical changes such as crystallization due to heat so that crevice may occur and leak current flows thereby leading to deterioration. Thus, as the organic EL material, material having the same property as the aforementioned $Alq_3$ (melting point: 418° C.) conventionally reputed to be excellent or material which has a higher melting point and is thermally stable is desirable.

(3) In organic EL device having the above construction ① in which the electron hole transporting layer and organic luminous layer are combined, energy gap with the electron hole transporting layer is not reduced so that exciplex is notformed. If exciplex is formed, sometimes EL luminance becomes not blue but green.

(4) Electrons and electron holes can be implanted so that carriers can move.

Upon consideration of the conventional organic EL device material emitting blue light from the above point of view, although azomethyn zinc complex Zn (1AZM-Hex) in Formula 4 described above for example produces a peak wave length in fluorescence of 450 nm emitting blue light, its melting point is 353° C. which is lower than 418° C. of $Alq_3$. Further, benzoxazole zinc complex Zn $(OXZ)_2$ in Formula 5 produces a peak wave length in fluorescence of 493 nm emitting bluish green light and its melting point is 354° C. which is lower like Formula 4.

SUMMARY OF THE INVENTION

Accordingly, an object of the present invention is to provide organic EL device material stable against heat, ensuring bluish light emission having a high purity and having a high efficiency to prevent diffusion of exciton to electrodes and organic EL device using the same material.

According to claim 1 of the present invention, there is provided an organic electroluminescence device in which electron implanted transporting layers, organic luminous layers and electron hole transporting layers are successively stacked between a pair of electrodes at least one of which is transparent, the organic luminous layer including aluminum complex composed of ligands having 2-(2'-hydroxy phenyl) benzo oxazol skeleton.

According to claim 2 of the present invention, there is provided an organic electroluminescence device according to claim 1 wherein the aluminum complex is μ-oxo[bis(2-(2'-benzo oxazolyl)-phenolate) aluminum (III)] and/or its derivative.

According to claim 3 of the present invention, there is provided an organic electroluminescence device according to claim 1 wherein a fluorescent substance different from the aluminum complex is added to the organic luminous layer.

According to claim 4 of the present invention, there is provided an organic electroluminescence device expressed in following formula 6.

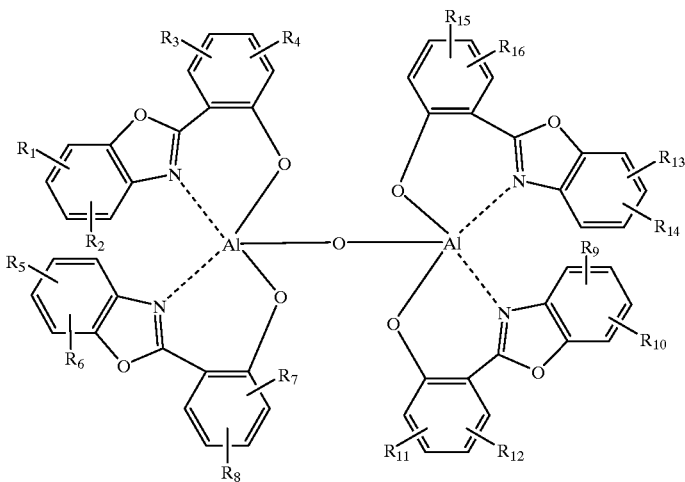

[Formula 6]

where R1–R16 denote hydrogen group, halogen group, alkyl group, cyano group, nitro group, ester group, amino group, mono or disubstituted amino group, acylamino group, hydroxy group, alkoxy group, mercapto group, alkoxy group, alkylthio group, arylthio group, siloxy group, acyl group, cyclo alkyl group, carbamoyl group, sulfonate group, imide group, substituted or unsubstituted aliphatic group, substituted or nonreplaced aliphatic cyclic ring group, substituted or unsubstituted carbocyclic aromatic cyclic group, substituted or unsubstituted hetroacylic aromatic ring group, substituted or unsubstituted hetero ring group.

According to claim 5 of the present invention, there is provided an organic electroluminescence device material according to claim 4 wherein substituted or unsubstituted aliphatic cyclic ring, substituted or unsubstituted carbon cyclic aromatic ring, substituted or unsubstituted heterocyclic aromatic ring, and substituted or unsubstituted hetero cyclic ring are formed with the substituted groups in the neighborhood.

DETAILED DESCRIPTION OF THE PREFERRED EMBODIMENTS

Figure 1:
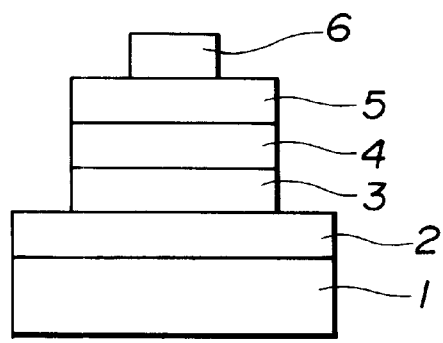
FIG. 1 is a diagram showing a structure of organic EL device according to the Example 1 of the present invention.

As a result of efforts made by inventors of this invention on research on chelate complex as organic electroluminescence device material emitting bluish light, it has been found that aluminum complex having oxadiazole as ligand has an excellent property. Formula 7 shows general formula of aluminum complex having ligand having 2-(2-hydroxy phenyl) benzo oxazol skeleton in a case in which four ligands are provided.

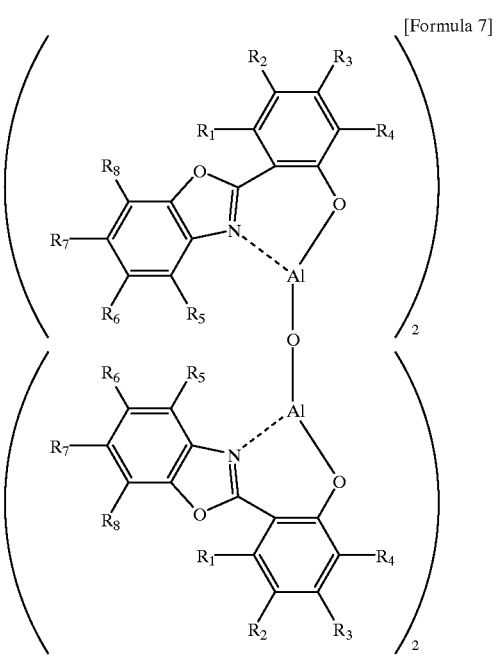

[Formula 7]

Here, R1–R8 are any one of following groups independently but they are not restricted to only these replaced groups.

hydrogen group, halogen group, cyano group, nitro group, carboxyl group, sulfone group, acylamino group, ester group, mono- or disubstituted amino group, alkoxy group, mercapto group or methyl group, ethyl group, propyl group, butyl group, sec-butyl group, tert-butyl group, pentyl group, hexyl group, heptyl group, octyl group, stearyl group, trichloromethyl group, aminomethyl group, acetooxymethyl group, acetooxyethyl group, acetooxypropyl group, acetooxybutyl group, hydroxymethyl group, hydroxyethyl group, hydroxypropyl group, hydroxybutyl group, vinyl group, styryl group, acetylene group, alkoxy group, mercapto group, alkyloxy group, alkilthio group, aryloxy group, arylthio group, siloxy group, acyl group, cycloalyl group, replaced group such as carbamoyl group or replaced or nonreplaced acyclic hydrocarbon group, cyclopropyl group, cyclohexyl group, 1,3-cyclohexadi dienil group, 2-cyclopentene-1-il group, 2,4-cyclopentadiene-1-iridenil group, phenyl group, biphenylel group, triphenylel group, tetraphenylel group, 2-methyl phenyl group, 3-nitro phenyl group, 4-methylthiophenyl group, 3,5-dicyanophenyl group, o-, m-, p-tolyl group, xylyl group, o-, m-, p-cumyl group, substituted or unsubstituted monocyclic hydrocarbon group such as mesityl group, penta rhenyl group, indenyl group, napthyl group, azulenyl group, heptalenyl group, acenaphtylenyl group, phenalenyl group, fluolenyl group, anthryl group, anthraquinonil group, 3-methylanthryl group, phenantolyl group, triphenylel group, pyrenyl group, crysenyl group, 2-ethyl-1-crysenyl, picenyl group, perilenyl group, 6-chloroperilenyl, pentaphenyl group, pentacenyl group, tetraphenylel group, hexaphenyl group, hexacenyl group, rubicenyl group, corronenyl group, trinaphthylenyl group, heptaphenyl group, substituted or unsubstituted condensed polycyclic hydrocarbon group such as pyranthrenyl group and oparenyl group, thienyl group, furyl group, pyrrolyl group, imidazolyl group, pyrazolyl group, pyridyl group, pylazinyl group, pyrimidinyl group, pyridazinyl group, indolyl group, quinolyl group, isoquinolyl group, phthalazinyl group, quinoxalynyl group, quinazolynyl group, carbazolyl group, acrydinyl group, phenadinyl group, furluryl group, isochiazolyl group, isothia zolyl group, isoquixazolyl group, furazanyl group, phenoquisadinyl group, benzthiazolyl group, benzoxazlyl group, benzoimidazolyl group, 2-methylpyridyl group, substituted or unsubstituted heterocyclic group such as 3-cyanopyridyl group or substituted or unsubstituted aromatic heterocyclic group, hydrogen group, methoxy group, ethoxy group, propoxy group, butoxy group, sec-butoxy group, tert-butoxy group, penthloxy group, hexyloxy group, stearyloxy group, phenoxy group, methylthio group, ethylthio group, propylthio group, butylthio group, sec-butylthio group, tert-butylthio group, bentylthio group, hexylthio group, hepthlthio group, oxtylthio group, phenythio group, amino group, methylamino group, dimethyl amino group, ethyl amino group, diethyl amino group, dipropyl amino group, dibutyl amino group, diphenyl amino group, bis(acetoxymethyl) amino group, bis(acetoxyethyl) amino group, bis (acetoxypropyl) amino group, bis(acetoxybutyl) amino group, dibenzyl amino group, methyl sulfamoyl group, dimethylsufamoyl group, ethyl sulfamoyl group, diethyl sulfamoyl group, propyl sulfamoyl group, butyl sulfamoyl group, pheny sulfamoyl group, diphenyl sulfamoyl group, ethyl carbamoyl group, diethyl carbamoyl group, propyl carbamoyl group, butyl carbamoyl group, phenyl carbamoyl group, methyl carbamoyl amino group, ethyl carbamoyl amino group, propyl carbamoyl amino group, butyl carbamoyl amino group, phenyl carbamoyl amino group, methoxy carbamoyl amino group, ethoxy carbamoyl amino group, propyl carbamoyl amino group, butoxy carbamoyl amino group, phenoxy carbonyl group, 2-(2-ethoxyethoxy) ethoxy group, 2-(2-ethoxyethoxy) ethylthio group, 2-[2-methoxyethoxy) ethoxy] ethylthio group.

Table 1 shows concrete examples of substances shown in Formula 7 with Examples 1–10. Methods of composition of substance in the respective examples and the like will be described below.

TABLE 1

| Example No. | R1~R4 | R5~R8 |
|---|---|---|
| 1 | H | H |
| 2 | H | R5 = CH$_3$ |
| 3 | H | R6 = OCH$_3$ |
| 4 | H | R7 = Ph |
| 5 | H | R7 = CN |
| 6 | H | R7 = OPh |
| 7 | H | R6 = cyclo Hex |
| 8 | H | R7 = F |
| 9 | H | R7 = NH$_2$ |
| 10 | H | R7 = Ethyl group |

(1) EXAMPLE 1

A structural formula of Al$_2$O(OXZ)$_4$ which is organic electroluminescence device material of Example 1 will be shown in Formula 8.

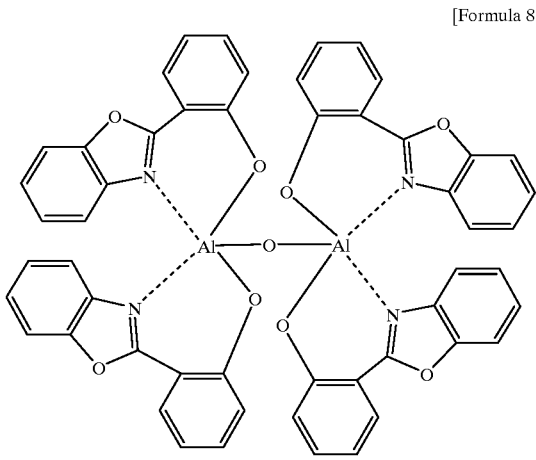

[Formula 8]

1) Synthetic method

Take toluene of 200 ml in a beaker of 500 ml and add 2-(2-hydroxy phenyl) benzo oxazol of 4.22 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 50%. Further, melt this in chloroform and remove foreign matter by recrystallization and sublimation refining to remove chloroform. Then this is used as organic EL material.

2) Identification of product

The structure of the product was determined by mass analysis, element analysis, FT-IR, NMR and thermal analysis.

(1) Mass analysis: m/e 910(M+)

(2) Element analysis: $C_{32}H_{32}N_4O_9Al_2$

|  | C | H | N |
| --- | --- | --- | --- |
| calculated value/% | 68.57 | 3.51 | 6.15 |
| measured value/% | 68.47 | 3.40 | 6.05 |

(3) Thermal analysis

The obtained powder was measured by thermal weight-differential thermal analysis (TG-DTA). The temperature range was from the ambient temperature to 500° C. As a result, a suction peak was observed at 176.2° C. and 423.0° C. 176.2° C. is melting point of the foreign matter and 423.0° C. is the melting point of $Al_2O(OXZ)_4$. It was found that the melting point was much higher than the melting point of 354° C. of $Zn(OXZ)_2$ and 353° C. of Zn(1AZM-Hex) and the substance of this embodiment was a stable material against heat.

(4) Fluorescent spectrum

Figure 2:
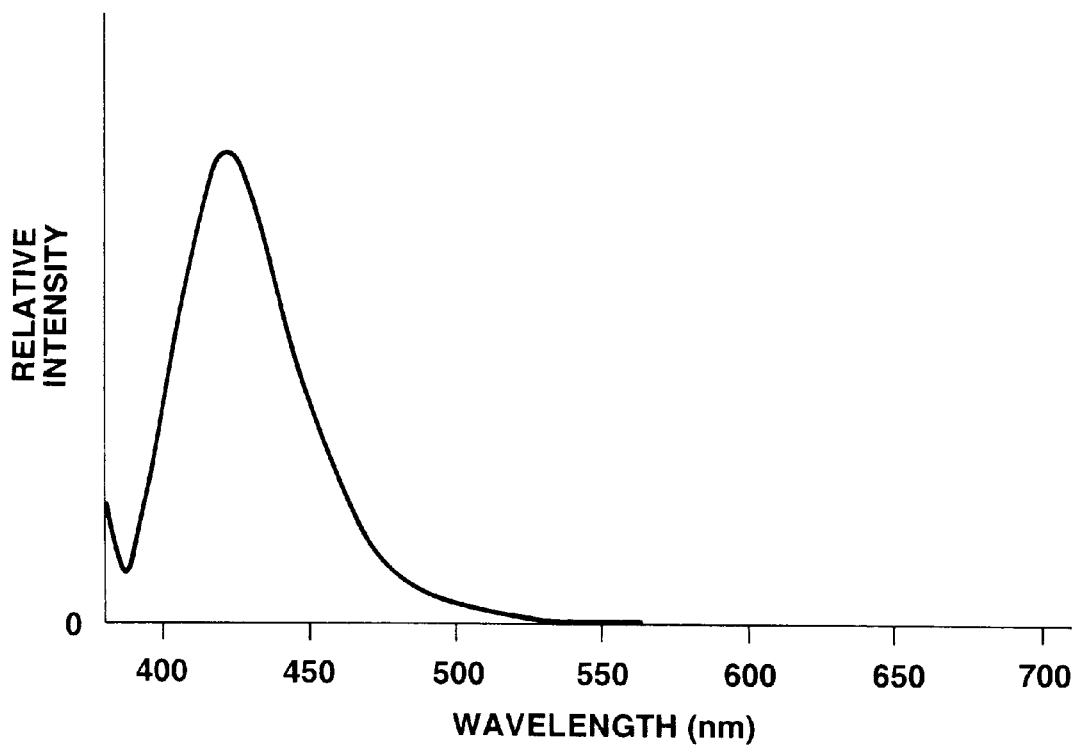
FIG. 2 is a diagram showing a fluorescent spectrum of solution of the organic EL device material according to the example 1 of the present invention.
Figure 3:
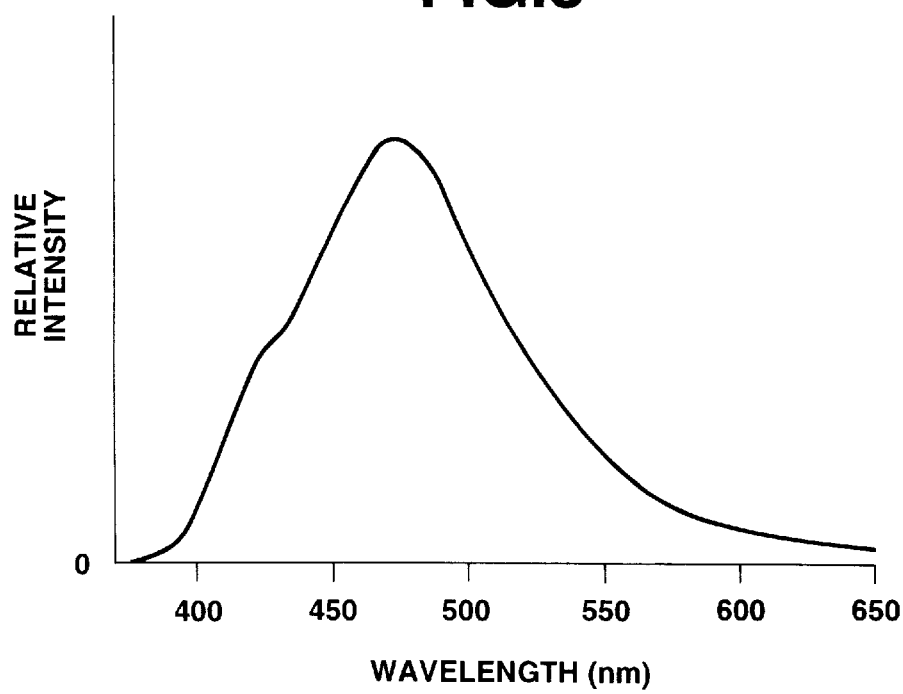
FIG. 3 is a diagram showing fluorescent spectrum of thin film of the organic EL device material according to the example 1 of the present invention.

The obtained powder was dissolved in ethanol solution of 0.1 mmol and the fluorescent spectrum of this solution was measured. As shown in FIG. 2, bluish fluorescent spectrum having its peak at 417.2 nm was observed. This maximum excitation spectrum was 381 nm.

(5) Thin film fluorescent spectrum

The obtained powder was metallized on a glass substrate and its fluorescent spectrum on the thin film was measured. This spectrum was bluish fluorescent spectrum having its peak at 468 nm and half-value width of 100 nm. The maximum excitation wave length of this spectrum was 468 nm.

(6) Ionization potential

Ionization potential of the thin film was measured with Riken Keiki made AC-1. As a result, 5.84 (eV) was obtained.

(7) Band gap

The obtained powder was metallized on glass substrate and then its band gap was obtained from that absorption. Eg was 3.13 (eV).

3) Production of EL element

First, as a comparative example, with the organic EL device material of this embodiment as organic luminous layer, two-layer structure organic EL device in which electron hole transporting layer was combined was produced. First, the ITO provided glass substrate was washed and dried, and then set in a vacuum metallizing apparatus and evacuated at $10^{-5}$ torr. After that, TPD as the electron hole transporting layer was metallized in 30 nm and then $Al_2O(OXZ)_4$ according to the present embodiment was metallized in 50 nm. Formula 9 indicates a structural formula of TPD.

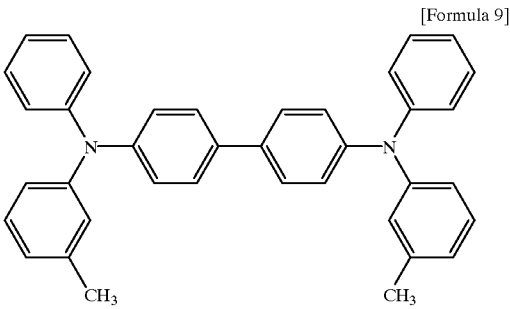

[Formula 9]

The vacuum condition was released temporarily and magnesium was deposited as an upper electrode to complete the EL element.

As a result of applying plus DC voltage on the ITO side of this element and minus DC voltage on the magnesium side, bluish light of 5 cd/m² maximum was emitted.

Although electron holes enter the organic luminous layer according to this example, it is considered that electrons are difficult to enter because the work function of Mg as cathode is large. Thus, this element was difficult to emit light and the luminance was about the value described above.

In the organic EL device in which the organic EL device material was used for the organic luminous layer of this example, to implant electrons into the organic luminous layer, a structure in which the organic luminous layer was sandwiched by the electron hole implanted transporting layer and the electron implanted transporting layer was employed. As shown in FIG. 1, glass substrate 1 in which ITO as the anode 2 was attached was washed and dried. Then, it was set in a vacuum metallizing apparatus and vacuum condition of $10^{-5}$ torr was produced. After that, TPD 3 as the electron hole implanted transporting layer was metallized in 30 nm and the vacuum condition was released. Next, the organic luminous layer 4 made of $Al_2O(OXZ)_4$ was deposited in 35 nm and further $Alq_3$ 5 as the electron implanted transporting layer was deposited in 25 nm. Further, as the cathode 6 of the upper electrode, Mg:Ag alloy (or Al:Li alloy) was deposited to complete the EL device. Meanwhile, it is permissible to provide m-MTDATA or copper-phthalocyanine as a buffer layer between the anode 2 and the TPD 3.

Figure 4:
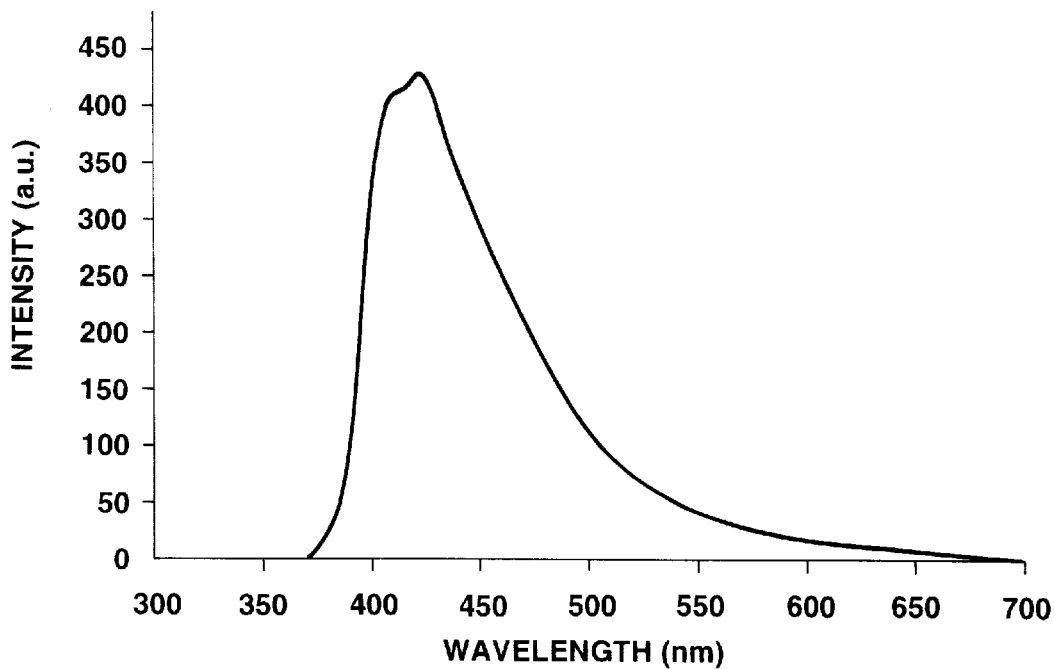
FIG. 4 is a diagram showing a spectrum of the organic EL device according to the example 1 of the present invention.
Figure 5:
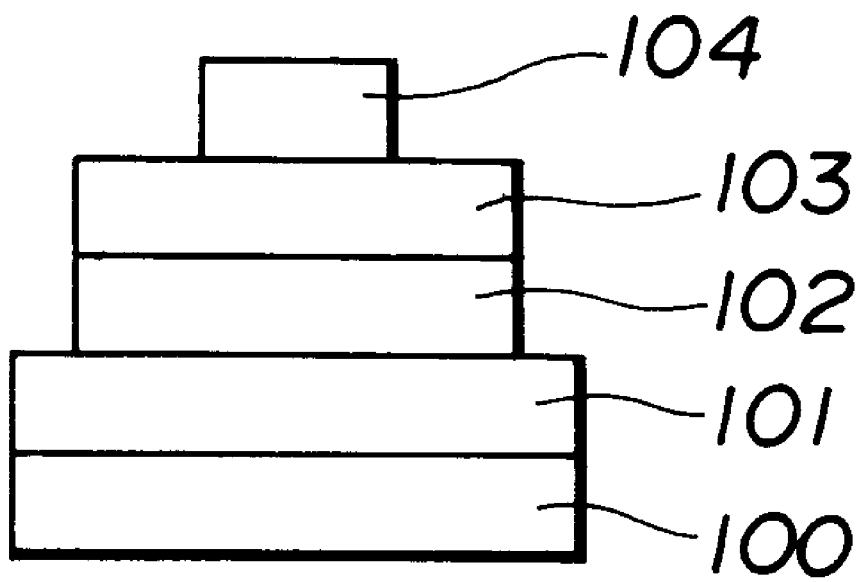
FIG. 5 is a diagram showing a basic composition of an organic EL having a structure in which electron hole transporting layer and organic luminous layer are combined.

As a result of applying plus DC voltage on the anode 2 (ITO side) of this organic EL device and minus DC voltage on the cathode 6 (magnesium side), bluish EL light emission of 1314 cd/m² was produced at 16V. The luminous spectrum was shown in FIG. 4. The peak wave length was 420 nm and chromaticity coordinate was x=0.185, y=0.178 on C.I.E. chromaticity diagram so that bluish light emission having a high purity was obtained.

As understood from an example of the organic EL device having two layers as a comparative example and the organic EL element having three layers as the example 1, the EL device having two layers, that is, a structure of ITO/TPD/$Al_2O(OXZ)_4$/Mg does not produce an effective light emission even if the organic EL device material of this embodiment is used. The reason is that because the LUMO level of the organic luminous layer was 2.74 (eV) and the work function of Mg was 3.7 (ev), a barrier of 0.96 (eV) existed so that electrons were difficult to implant from the cathode thereby lowering the luminous intensity.

Then, as shown in FIG. 1, Alq$_3$ 5 was provided as an electron implanted transporting layer between the cathode 6 and the organic luminous layer 4, so that the energy barrier could be lowered. Because the LUMO level of Alq$_3$ is 2.85 (eV), a voltage between the cathode and Alq$_3$ is 0.85 (eV) and a voltage between Alq$_3$ and Al$_2$O(OXZ)$_4$ is 0.11 (eV). Thus, implanting of electrons into the organic luminous layer 4 is facilitated so that the luminous intensity is improved. Thus, the organic EL device employing the organic EL device material of this embodiment as the organic luminous layer needs to be so structured that the organic luminous layer is sandwiched between the electron hole implanted transporting layer and the electron implanted transporting layer.

As the above electron hole implanted transporting layer, in addition to the TPD, for example aromatic class 3 amine, hydrazone derivative, carbazole derivative, triazole derivative, imidazole derivative and oxaziazole derivative having amino group can be used.

When the above electron hole implanted transporting layers are installed by means of the electron hole implanted layer and the electron hole transporting layer separately, it is possible to select and use a desirable combination from compounds for the electron hole implanted transporting layer. At this time, it is favorable to stack compounds in order of ionization potential from smaller one from the anode (ITO, etc.) side.

Concretely, triphenyl amine derivative (m-MTDATA etc.) called star-bar stoamine, copper phthalocyanine or the like are used for the electron hole implanted layer. As the electron hole transporting material, it is possible to use TPD or the like which is a dimer of triphenyl amine.

As the electron implanted transporting layer, in addition to the above Alq$_3$, it is possible to use organic metallic complex derivative such as aluminum quinolinol, oxaziazole derivative, pyridine derivative, quinoline derivative, quinoquisaline derivative, di-phenyl quinoline derivative, perylene derivative, nitro-replaced fluorene derivative can be used.

When the electron implanted transporting layer is installed by dividing the electron implanted layer and the electron transporting layer, it is possible to use selectively a favorable combination from compounds for the electron implanted transporting layer. At this time, it is favorable to stack compounds in the order of electronic affinity from its larger one from the cathode side.

Although the organic EL device material of this embodiment shown in Formula 8 emits bluish light, it is possible to perform wave length conversion by using this organic EL element material as host material and doping fluorescent substance into this material. For example, as other fluorescent material, it is possible to use organic pigments such as perylene (Blue), quinacridone (yellowish green), rubrene (yellow), coumarin (bluish green), styryl pigment (long wave-length side blue) and rare earth complex such as Europium complex. At least one fluorescent substance can be used and its content is desired to be less than 5 mol % in terms of Formula 8. using such a compound enables to shift the luminance spectrum to its long wave-length side. If the respective colors described above can be obtained, it is possible to cover almost all visible range. Thus multi-color or full-color organic EL devices can be realized.

Further, it is possible to make the above organic luminous layer contain single state oxygen quencher. As this quencher, it is possible to use nickel complex, rubrene, diphenyl isobenzofuran, and class 3 amine. The content of the quencher is desired to be less than 10 mol % in terms of Formula 8.

Thickness of the above organic luminous layer, thickness of the above electron hole implanted transporting layer and thickness of the electron implanted transporting layer are not restricted to particular values but different depending on formation method. However, usually these thicknesses are desired to be 5–1000 nm, particularly 8–200 nm is desirable.

For the above cathode 6, it is desirable to use material having a small work function, such as Li, Na, Mg, Al, Ag, In or an alloy containing at least one of them.

To make the above organic EL device emit light from its plane, it is necessary to make at least one of the electrodes transparent or semi-transparent. Concretely, it should be formed of conductive polymer such as ITO, SnO$_2$, Ni, Au, Pt, Pd, polypyrol or the like and the resistance should be set in a range of 10–30 Ω/□.

To pick up light emission from the substrate 1, transparent or semi-transparent material such as glass and resin should be used for the substrate 1. It is permissible to control luminous color by using a color filter or conductive reflective film for the substrate 1.

In the production method for the organic EL device described above, it is desirable that the cathode 6 and the anode 2 are formed by metallizing method or sputtering method. The above electron hole implanted transporting layer, organic luminous layer and electron implanted transporting layer are desired to be formed according to vacuum metallizing method.

(2) EXAMPLE 2

The structural formula of Al$_2$O(OXZ)$_4$ which is organic electroluminescence device material of the example 2 is shown in Formula 10.

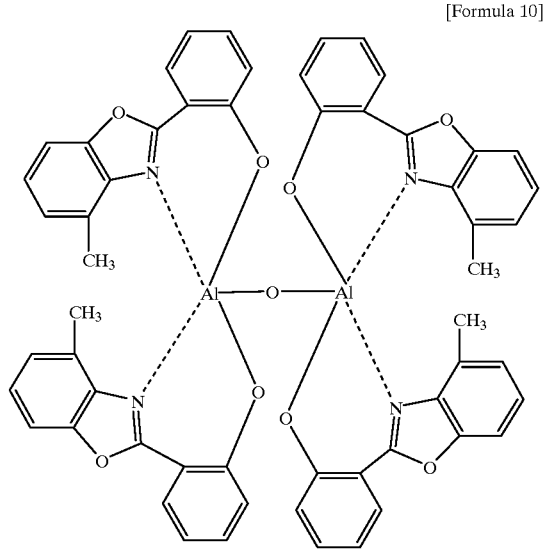

[Formula 10]

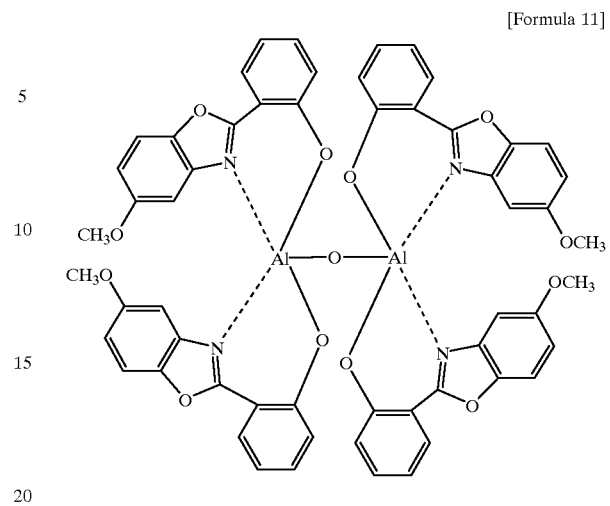

[Formula 11]

1) Synthetic method

Take toluene of 200 ml in a beaker of 500 ml and add 2-(2-hydroxy phenyl)-4-methylbenzooxazol of 4.5 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 48%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 966(M+)

(2) Element analysis: $C_{56}H_{40}N_4O_9Al_2$

|  | C | H | N |
|---|---|---|---|
| calculated value/% | 69.57 | 4.14 | 5.80 |
| measured value/% | 69.30 | 4.06 | 5.65 |

(3) EXAMPLE 3

The structural formula of $Al_2O(OXZ)_4$ which is organic electroluminescence device material of the example 3 is shown in Formula 11.

1) Synthetic method

Take toluene of 200 ml in a beaker of 500 ml and add 2-(2-hydroxy phenyl)-5-methoxylbenzooxazol of 4.82 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 45%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1030(M+)

(2) Element analysis: $C_{56}H_{40}N_4O_{13}Al_2$

|  | C | H | N |
|---|---|---|---|
| calculated value/% | 65.24 | 3.88 | 5.44 |
| measured value/% | 65.12 | 3.72 | 5.23 |

(4) EXAMPLE 4

The structural formula of $Al_2O(OXZ)_4$ which is organic electroluminescence device material of the example 4 is shown in Formula 12.

[Formula 12]

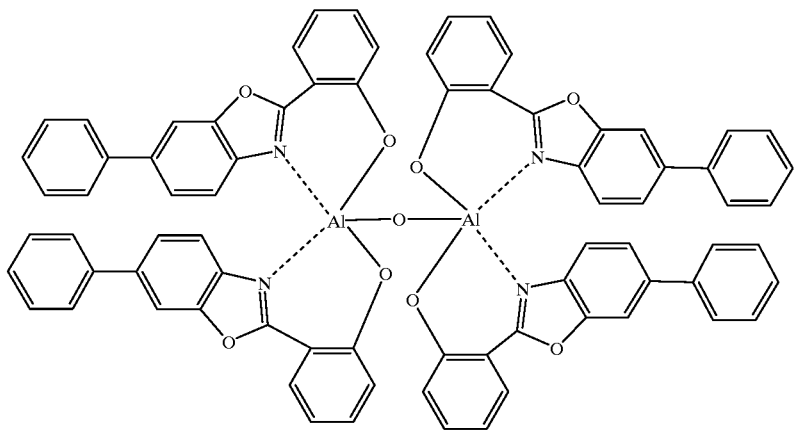

1) Synthetic method

Take toluene of 200 ml in a beaker of 500 ml and add 2-(2-hydroxy phenyl)-6-phenylbenzooxazol of 5.74 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 52%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1214(M+)

(2) Element analysis: $C_{76}H_{48}N_4O_9Al_2$

|  | C | H | N |
|---|---|---|---|
| calculated value/% | 75.12 | 3.95 | 4.61 |
| measured value/% | 75.22 | 3.83 | 4.53 |

(5) EXAMPLE 5

The structural formula of $Al_2O(OXZ)_4$ which is organic electroluminescence device material of the example 5 is shown in Formula 13.

[Formula 13]

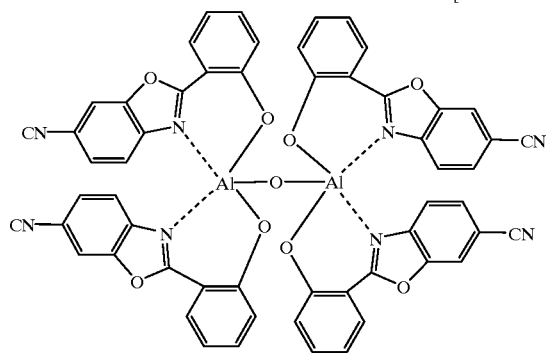

1) Synthetic method

Take toluene of 200 ml in a beaker of 500 ml and add 2-(2-hydroxy phenyl)-6-cyanobenzooxazol of 4.22 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 50%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1010(M+)

(2) Element analysis: $C_{56}H_{28}N_8O_9Al_2$

|  | C | H | N |
|---|---|---|---|
| calculated value/% | 66.53 | 2.77 | 11.09 |
| measured value/% | 66.61 | 2.62 | 11.14 |

(6) EXAMPLE 6

The structural formula of $Al_2O(OXZ)_4$ which is organic electroluminescence device material of the example 6 is shown in Formula 14.

[Formula 14]

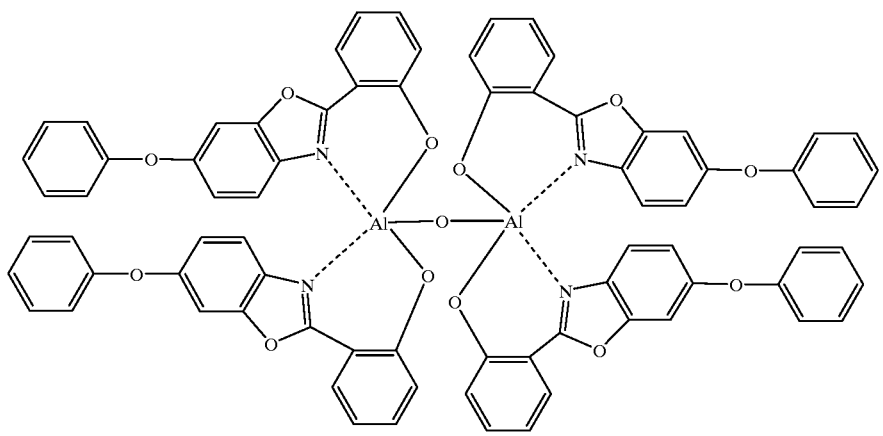

1) Synthetic method

Take toluene of 200 ml in a beaker of 500 ml and add 2-(2-hydroxy phenyl)-6-phenoxybenzooxazol of 6.06 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 42%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1278(M+)

(2) Element analysis: $C_{76}H_{48}N_4O_{13}Al_2$

|  | C | H | N |
|---|---|---|---|
| calculated value/% | 71.36 | 3.76 | 4.38 |
| measured value/% | 71.35 | 3.81 | 4.21 |

(7) EXAMPLE 7

The structural formula of $Al_2O(OXZ)_4$ which is organic electroluminescence device material of the example 7 is shown in Formula 15.

[Formula 15]

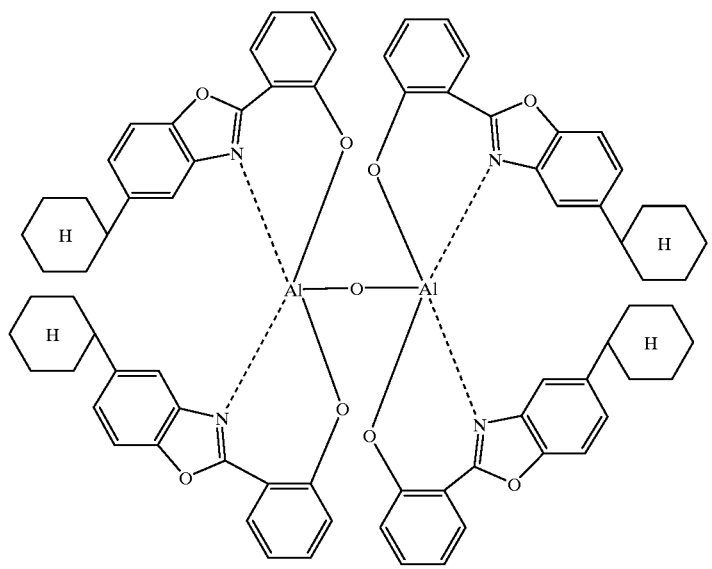

1) Synthetic method

Take toluene of 200 ml in a beaker of 500 ml and add 2-(2-hydroxy phenyl)-5-cyclohexyl benzooxazol of 5.86 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 49%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1238(M+)
(2) Element analysis: $C_{76}H_{72}N_4O_9Al_2$

|  | C | H | N |
|---|---|---|---|
| calculated value/% | 73.67 | 5.82 | 4.52 |
| measured value/% | 73.55 | 5.71 | 4.59 |

(8) EXAMPLE 8

The structural formula of $Al_2O(OXZ)_4$ which is organic electroluminescence device material of the example 8 is shown in Formula 16.

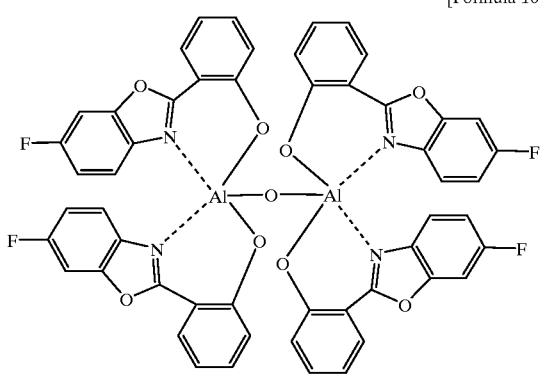

[Formula 16]

1) Synthetic method

Take toluene of 200 ml in a beaker of 500 ml and add 2-(2-hydroxy phenyl)-6-fluorobenzooxazol of 4.58 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 55%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 982(M+)
(2) Element analysis: $C_{52}H_{28}N_4O_9Al_2F_4$

|  | C | H | N |
|---|---|---|---|
| calculated value/% | 63.54 | 2.85 | 5.70 |
| measured value/% | 63.50 | 2.76 | 5.65 |

(9) EXAMPLE 9

The structural formula of $Al_2O(OXZ)_4$ which is organic electroluminescence device material of the example 9 is shown in Formula 17.

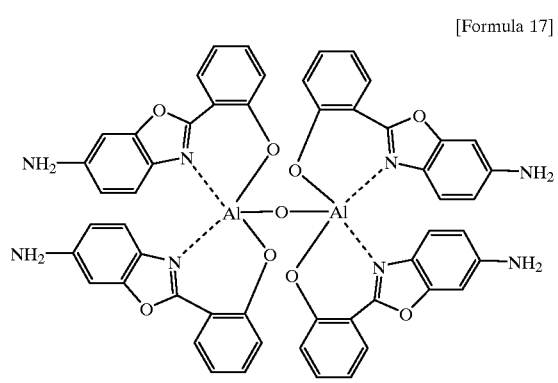

[Formula 17]

1) Synthetic method

Take toluene of 200 ml in a beaker of 500 ml and add 2-(2-hydroxy phenyl)-6-aminobenzooxazol of 4.33 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 51%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 970(M+)
(2) Element analysis: $C_{52}H_{36}N_8O_9Al_2$

|  | C | H | N |
|---|---|---|---|
| calculated value/% | 64.33 | 3.71 | 11.55 |
| measured value/% | 64.21 | 3.63 | 11.45 |

(10) EXAMPLE 10

The structural formula of $Al_2O(OXZ)_4$ which is organic electroluminescence device material of the example 10 is shown in Formula 18.

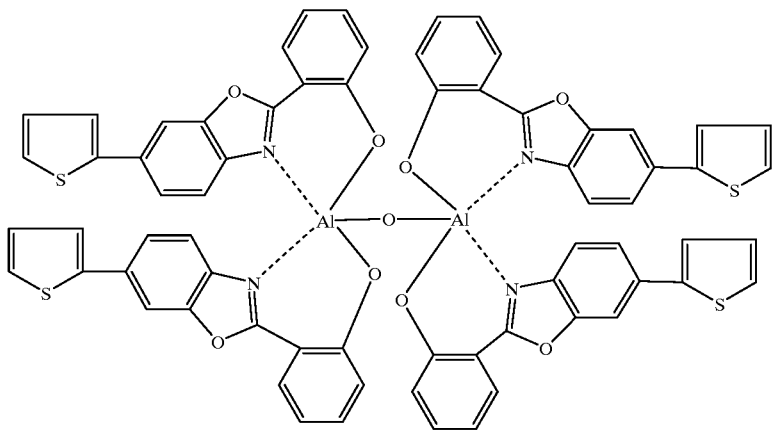

[Formula 18]

1) Synthetic method

Take toluene of 200 ml in a beaker of 500 ml and add 2-(2-hydroxy phenyl)-6-(2-chienyl) benzooxazol of 5.87 g (0.02 mol) and aluminum-di-normal butoxy-monoethylacetate of 3.2 g (0.01 mol) and then agitate to dissolve under ambient temperatures. Leave this solution through a night and day. Then, depressurize to distill and remove toluene. Wash left solid component with toluene. After that, dry under vacuum. The yield of this rough product is 56%. Further, remove foreign matter by recrystallization and sublimation refining. Then this is used as organic EL material.

2) Identification of product

The structure of the product was determined by mass analysis, element analysis, FT-IR, NMR and thermal analysis.

(1) Mass analysis: m/e 1238(M+)

(2) Element analysis: $C_{68}H_{40}N_4O_9S_4Al_2$

|  | C | H | N |
|---|---|---|---|
| calculated value/% | 65.91 | 3.23 | 4.52 |
| measured value/% | 65.76 | 3.11 | 4.41 |

Although in the above examples 2–10, effects of thermal analysis, fluorescent spectrum, ionization potential, band gap, and organic EL device upon a case in which a synthesized product is used in the organic luminous layer has not been described, these matters in the examples 2–10 are substantially the same as the respective corresponding items of the example 1. That is, the respective materials of the examples 2–10 have a melting point higher than $Alq_3$ and indicate bluish fluorescent spectrum having a higher purity. Its ionization potential is more excellent than $Alq_3$ and the band gap is substantially the same as the example 1. Further, the organic EL device having three layers produced with these materials indicated substantially the same luminous intensity as the example 1 and showed bluish light emission having a high purity.

The organic EL device material according to this invention is thermally stabilized, difficult to deteriorate and provides bluish light emission having a high purity. Further, the organic EL device made of this organic EL device material is more stabilized in terms of storage than a conventional organic EL device and provides a bluish light emission having a higher purity. Because the device structure is three layer structure in which the organic luminous layer is sandwiched by the electron implanted transporting layer and the electron hole implanted transporting layer, diffusion of exciton to electrodes is prevented thereby improving the efficiency so that reactive current is reduced thereby improving its service life.

What is claimed is:

1. An organic electroluminescent device comprising:

at least one electron transporting layer;

at least one organic luminous layer; and at least one electron hole transporting layer;

wherein said electron transporting layers said organic luminous layer and said hole transporting layer are successively stacked between a pair of electrodes at least one of which is transparent, said organic luminous layer further comprising an aluminum complex said aluminum complex having substituted, or unsubstituted 2-(2-hydroxyphenyl) benzoxazole ligands.

2. An organic electroluminescent device according to claim 1 wherein said aluminum complex comprises at least one member selected from the group consisting of μ-oxo bis(2-(2-benzo oxazolyl)-phenolate) aluminum (III) and derivatives thereof.

3. An organic electroluminescent device according to claim 1 wherein a fluorescent substance different from said aluminum complex is added to said organic luminous layer.

4. An organic electroluminescent device expressed in following formula 1:

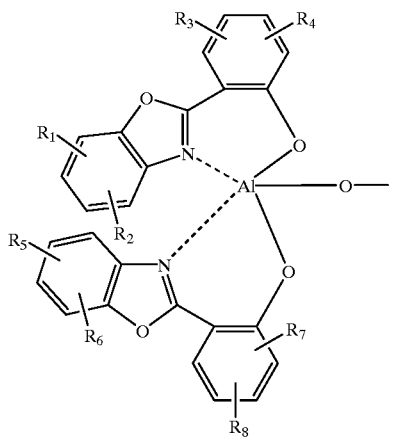

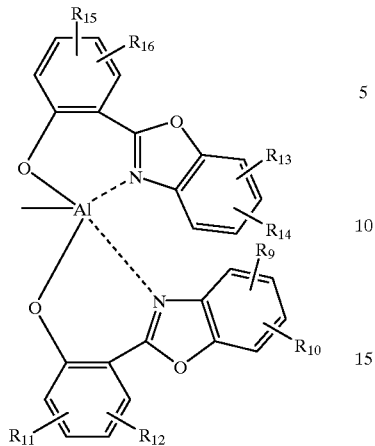

wherein each of R₁–R₁₆ denote a hydrogen group, halogen group, alkyl group, cyano group, nitro group, O-acyl group, amino group, mono or disubstituted amino group, acylamino group, hydroxy group, alkoxy group, mercapto group, alkyloxy group, alkylthio group, arylthio group, siloxy group, acyl group, cycloalkyl group, carbamoyl group, sulfonate salt, sulfonic acid, alkylsulfonic ester imide group, substituted or unsubstituted aliphatic group, substituted or unsubstituted aliphatic cyclic group, carbocyclic aromatic cyclic group, substituted or unsubstituted heterocyclic aromatic group, substituted or unsubstituted heterocyclic group.

5. An organic electroluminescent device material according to claim 4 wherein said substituted or unsubstituted aliphatic cyclic group said substituted or unsubstituted carbocyclic aromatic ring, said substituted or unsubstituted heterocyclic aromatic ring, and said substituted or unsubstituted heterocyclic ring are vicinally substituted.

6. An organic electroluminescent device comprising:

an anode;

a cathode; and a light emitting organic material disposed therebetween;

wherein said light emitting organic material comprises Al₂O(Box)₄ having the following formula:

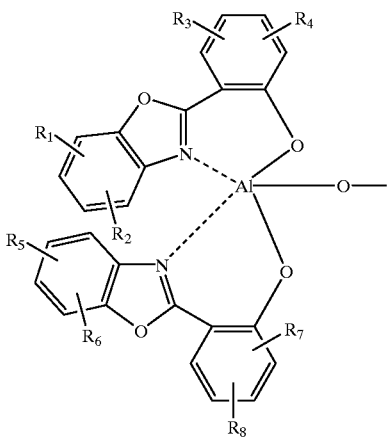

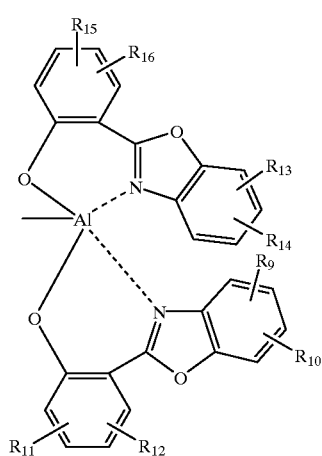

wherein R₁–R₁₆ are substituents, each of said substituents comprising at least one member individually selected from the group consisting of hydrogen atom, halogen atom, alkyl group, cyano group, nitro group, O-acyl group, amino group, mono or di-substituted amino group, acylamino group, hydroxyl group, alkoxy group, mercapto group, alkyloxy group, alkylthio group, aryloxy group, arylthio group, siloxy group, acyl group, cycloalkyl group, carbamoyl group, carboxylic acid, sulfonic acid group, imide group, a substituted or un-substituted aliphatic group, a substituted or un-substituted aliphatic cyclic group, a substituted or un-substituted carbocyclic aromatic cyclic group, a substituted or un-substituted heterocyclic aromatic cyclic group, and a substituted or non-substituted heterocyclic group.

7. The organic electroluminescent device of claim 6, wherein said anode is transparent.

8. The organic electroluminescent device of claim 6, wherein said cathode is transparent.

9. The organic electroluminescent device of claim 6, further comprising a hole transporting material deposited between said anode and said light emitting organic material and an electron transporting material deposited between said light emitting organic material and said cathode.

10. The organic electroluminescent device of claim 6, wherein a fluorescent material different from said Al₂O(Box)₄ is added to said light emitting organic material.

11. An organic electroluminescent material comprising:

Al$_2$O(Box)$_4$ having the following formula:

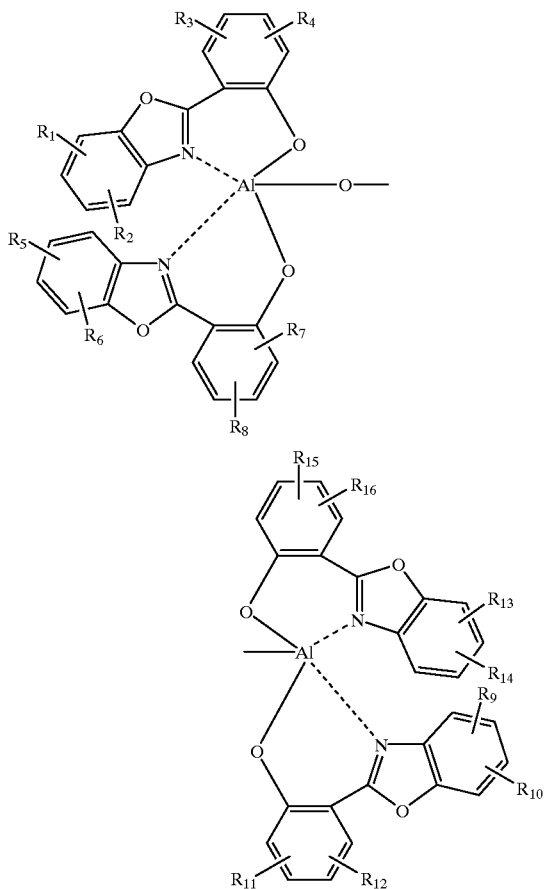

wherein, $R_1$-$R_{16}$ are substituents, each of said substituents comprising at least one member individually selected from the group consisting of hydrogen atom, halogen atom, alkyl group, cyano group, nitro group, ester group, amino group, mono or di-substituted amino group, acylamino group, hydroxyl group, alkoxy group, mercapto group, alkyloxy group, alkylthio group, aryloxy group, arylthio group, siloxy group, acyl group, cycloalkyl group, carbamoyl group, carboxylic acid, sulfonic acid group, imide group, a substituted or unsubstituted aliphatic group, a substituted or unsubstituted aliphatic cyclic group, a substituted or unsubstituted carbocyclic aromatic cyclic group, a substituted or unsubstituted heterocyclic aromatic cyclic group, and a substituted or un-substituted heterocyclic group.

12. The organic electroluminescent material of claim 11, wherein at least two of said substituents are bonded to adjacent carbon atoms and comprise a cyclic structure, said cyclic structure further comprising at least one member of the group consisting of a substituted or unsubstituted aliphatic cyclic compound, a substituted or un-substituted carboncyclic aromatic cyclic compound, a substituted or unsubstituted heterocyclic aromatic cyclic compound, and a substituted or unsubstituted heterocyclic compound.

* * * * *